(12) United States Patent
Im et al.

(10) Patent No.: US 8,354,671 B1
(45) Date of Patent: Jan. 15, 2013

(54) INTEGRATED CIRCUIT WITH ADAPTIVE VGG SETTING

(75) Inventors: Hsung Jai Im, San Jose, CA (US); Henley Liu, San Jose, CA (US); Jae-Gyung Ahn, Pleasanton, CA (US); Tony Le, San Jose, CA (US); Patrick J. Crotty, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 205 days.

(21) Appl. No.: 12/781,627

(22) Filed: May 17, 2010

(51) Int. Cl.
*H01L 23/58* (2006.01)
*H01L 29/10* (2006.01)
*H01L 21/66* (2006.01)
*G01R 31/26* (2006.01)
*G01N 27/00* (2006.01)

(52) U.S. Cl. ............... 257/48; 438/14; 438/17; 438/18; 324/71.5

(58) Field of Classification Search .................. None
See application file for complete search history.

(56) References Cited

U.S. PATENT DOCUMENTS

| | | | |
|---|---|---|---|
| 6,133,746 A * | 10/2000 | Fang et al. | 324/762.09 |
| 6,249,460 B1 * | 6/2001 | Forbes et al. | 365/185.28 |
| 6,477,090 B2 * | 11/2002 | Yamaki et al. | 365/189.09 |
| 6,731,130 B1 * | 5/2004 | Yang et al. | 324/762.09 |
| 6,831,294 B1 * | 12/2004 | Nishimura et al. | 257/48 |
| 7,155,359 B1 * | 12/2006 | Kim et al. | 702/117 |
| 7,230,812 B2 * | 6/2007 | Alam et al. | 361/93.1 |
| 7,340,360 B1 * | 3/2008 | Zhang et al. | 702/81 |
| 2004/0077110 A1 * | 4/2004 | Kang et al. | 438/14 |
| 2004/0145384 A1 * | 7/2004 | Bernstein et al. | 324/765 |
| 2005/0278677 A1 * | 12/2005 | Ang et al. | 716/9 |
| 2006/0123280 A1 * | 6/2006 | Tran et al. | 714/718 |
| 2009/0224795 A1 * | 9/2009 | Nicollian et al. | 324/769 |

* cited by examiner

*Primary Examiner* — N Drew Richards
*Assistant Examiner* — Michael Jung
(74) *Attorney, Agent, or Firm* — Scott Hewett; Gerald Chan; Thomas George

(57) ABSTRACT

A technique for setting Vgg in an IC is disclosed. The technique includes specifying a design reliability lifetime for the IC, and a relationship between maximum gate bias and gate dielectric thickness for the IC sufficient to achieve the design reliability lifetime is established. The IC is fabricated and the gate dielectric thickness is measured. A maximum gate bias voltage is determined according to the gate dielectric thickness and the relationship between maximum gate bias and gate dielectric thickness, and a Vgg trim circuit of the IC is set to provide Vgg having the maximum gate bias voltage that will achieve the design reliability lifetime according to the measured gate dielectric thickness.

15 Claims, 4 Drawing Sheets

US 8,354,671 B1

INTEGRATED CIRCUIT WITH ADAPTIVE VGG SETTING

FIELD OF THE INVENTION

An embodiment of the invention relates generally to integrated circuits, and more particularly to interconnect circuits in configurable devices.

BACKGROUND

Many ICs are made up of millions of interconnected devices, such as transistors, resistors, capacitors, and diodes, on a single chip of semiconductor substrate. CMOS circuits and fabrication technology are commonly used in complex ICs. CMOS circuits use PMOS and NMOS devices to implement functions such as logic.

Field-programmable gate arrays ("FPGAs") are a type of configurable logic device that often incorporate CMOS techniques in some functional blocks of the FPGA, such as logic blocks, and incorporate other techniques, such as NMOS techniques, in other functional blocks, such as interconnect blocks. An interconnect block is basically a matrix of user-selectable switches that connect circuits and nodes of other portions of the FPGA together, or connect circuits and nodes of FPGA to external pins. The interconnect and logic blocks allow the FPGA to be configured into a variety of circuits to perform user-specified operations.

Interconnect circuits often include pass gates that are controlled at a higher voltage (Vgg) than the standard logic power supply voltage (Vdd) used to drive gates in other functional blocks of the IC. Driving pass gates with sufficient Vgg, rather than Vdd, allows a digital signal at the Vdd level to pass through an NMOS pass gate without signal level reduction. If the NMOS pass gate were driven at Vdd, the output level would be Vdd minus the threshold level (Vth) of the NMOS pass gate.

Driving NMOS pass gates with Vgg also improves the speed at which data is transferred through the pass gate. The pass gate contribution of the interconnect signal delay is reduced with increasing Vgg. However, Vgg cannot be made arbitrarily high. Higher drive voltages reduce reliability through various degradation mechanisms, such as hot carrier injection (HCI) and time dependent dielectric breakdown (TDDB). An upper limit of Vgg is often determined by reliability considerations.

In many ICs, the value of Vgg can be set by programming an on-chip power supply. A fixed value of Vgg is set for a particular operating condition, such as temperature, for ICs of the same type (e.g., for FPGAs of a particular family or technology). The Vgg value is defined as the highest gate bias that insures reliable operation (i.e., without gate dielectric breakdown) for a specified time (e.g., twenty years) and at a minimum oxide thickness, generally the thinnest variation according to the fabrication process. The actual Vgg level in an FPGA follows a pre-programmed temperature response in order to compensate for temperature effects on gate dielectric reliability.

While this approach is simple and provides reliable devices, it results in a conservative Vgg setting that does not allow maximum speed because most of the devices will have a gate dielectric thickness greater than the minimum allowed within the process specifications.

Techniques for setting Vgg that provide higher performance of interconnect circuits without compromising reliability are desired.

SUMMARY

An IC wafer has an IC with a Vgg supply circuit capable of being programmed to establish a gate bias voltage. In a particular embodiment, the Vgg voltage is set by programming a Vgg trim circuit, such as a programmable resistor network. The IC wafer includes a gate dielectric thickness test structure, which is defined in the IC or elsewhere in the IC wafer, such as within a scribe alley.

In a particular embodiment, the gate dielectric test structure includes a test pad that is electrically isolated from other nodes of the IC, an NMOS gate leakage current device connected to the test pad through a first switch, and a PMOS gate leakage current device connected to the test pad through a second switch. The Vgg supply circuit is programmed to provide a Vgg voltage according to a gate dielectric thickness value measured using the gate dielectric test structure.

An embodiment of setting Vgg in an IC includes specifying a design reliability lifetime for the IC and establishing a relationship between maximum gate bias and gate dielectric thickness for the IC sufficient to achieve the design reliability lifetime. An IC wafer including the IC is fabricated and a gate dielectric thickness of the IC is measured. A maximum gate bias voltage for the IC according to the gate dielectric thickness and the relationship between maximum gate bias and gate dielectric thickness is determined, and Vgg of the IC is set to the maximum gate bias voltage ensuring the design reliability lifetime (i.e., the optimal Vgg for the IC according to the measured gate dielectric thickness).

DETAILED DESCRIPTION

Individual IC die are evaluated for their TDDB limit of Vgg, and the measured result is used to trim each die. This allows Vgg to be set according to the actual gate dielectric strength, rather than conservatively setting Vgg based on the thinnest manufacturing specification. A test structure is incorporated on each die for TDDB testing. TDDB, rather than HCI, is a concern in interconnect circuits because the transistors (pass gates) that are operated off of Vgg are either turned off or are in deep triode mode, and do not switch under normal usage. In a particular embodiment, gate dielectric thickness is determined by measuring gate leakage currents of NMOS and PMOS capacitors versus Vgg. Prior characterization of oxide thickness versus gate leakage current and oxide thickness versus optimum Vgg level is used to select the optimum Vgg level for each die on an individualized basis.

Figure 1:
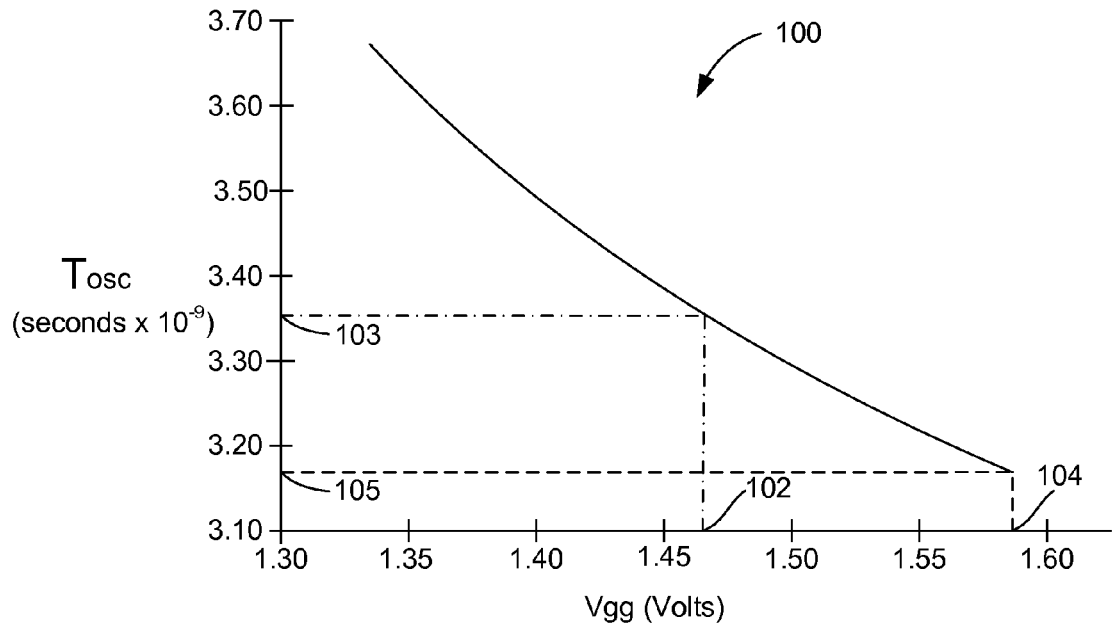
FIG. 1 is a plot of the measured ring oscillator period versus Vgg in an FPGA.

FIG. 1 is a plot 100 of the measured ring oscillator period versus Vgg in an FPGA. In a particular embodiment, a 16-stage ring oscillator was configured in the FPGA and its output frequency was measured as a waveform on an oscilloscope, from which the period was calculated. A lower Tosc denotes faster operation. The FPGA had a trimmable resistor network that allowed setting the Vgg to 32 different levels (from about 1.337 V to about 1.576 V). The plot 100 shows that higher Vgg provides lower Tosc, hence faster operation. Tosc of a ring oscillator is often used as a metric to indicate how fast an IC design can run.

In a conventional application, Vgg would be set at level 102 (about 1.465 V) that would be sufficiently conservative to avoid a high reliability failure rate. For example, if the IC fabrication process had a nominal gate dielectric (gate oxide) thickness of about 23 Angstroms with a 10% variation, the thinnest gate oxide of an IC produced by the fabrication process could be about 21 Angstroms, while the thickest gate oxide could be about 25 Angstroms. In conventional applications, the Vgg is set so that an IC having gate oxide on the lower end of the specification (i.e., a gate oxide of about 21 Angstroms) will operate reliably over the designed lifetime of the IC. For example, a Vgg of about 1.465 provides reliable operation for 21-Angstrom gate oxide devices, and results in a Tosc 103 of about $3.37 \times 10^{-9}$ second.

However, an IC having a gate oxide thickness of 23 Angstroms (the nominal thickness) could be set to a higher level and reliably operate at a Vgg level 104 of 1.59 V, and would have an expected Tosc 105 of about $3.16 \times 10^{-9}$ second. An IC having a gate oxide thickness at the top of the allowable fabrication limit, about 25 Angstroms, would be able to be operated at a Vgg level of about 1.72 V (which is off the scale of FIG. 1, see FIG. 2), and operate with even a lower Tosc. While the relationship between Vgg and Tosc is not precisely linear, in the region of interest there is about 15% increase in operating speed for each 200 mV increase in Vgg. In an embodiment, Vgg for an IC having a gate oxide thickness of 23 Angstroms would be set at a level of about 1.59 V, resulting in an improvement of operating speed of about 5%. Embodiments provide techniques for monitoring the Vgg levels an IC can tolerate while maintaining reliable operation so that the Vgg level can be trimmed to a more optimal value.

Figure 2:
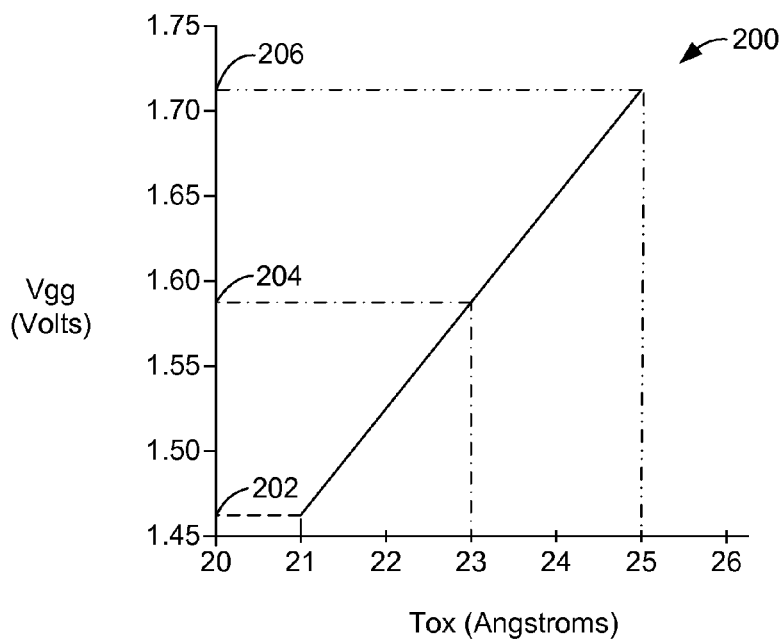
FIG. 2 is a plot of calculated Vgg versus gate oxide thickness for a 20 year reliability specification of an FPGA.

FIG. 2 is a plot 200 of calculated Vgg versus gate oxide thickness for a 20 year reliability specification of an FPGA. The y-axis (Vgg) represents the highest Vgg level that will ensure a 20-year device lifetime (20-year reliability). Those of skill in the art of IC reliability understand that reliability lifetimes are statistical, and that some individual ICs might fail within the specified lifetime. In order for a gate oxide thickness (Tox) of 21 Angstroms to meet the 20-year reliability specification, Vgg should not exceed about 1.465 V. This Vgg level 202 is the value that would be set for all ICs of a design according to conventional techniques that set Vgg to the lowest allowable Tox that might be produced within the fabrication specification limits. ICs that have a Tox of 23 Angstroms could meet the 20-year reliability specification using a Vgg level 204 of about 1.59 V. ICs that have the maximum allowed Tox of 25 Angstroms can use a Vgg level 206 of about 1.72 V and meet the 20-year reliability specification. The failure mechanism for Vgg stress of gate oxide in interconnect circuits is usually TDDB.

Figure 3:
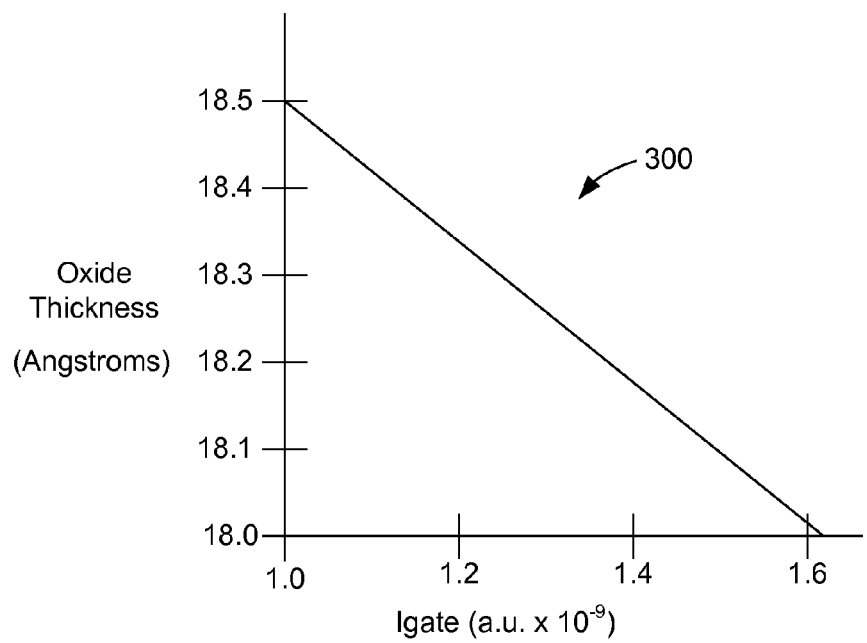
FIG. 3 is a plot of measured oxide thickness versus gate leakage current for an oxide test structure according to an embodiment

FIG. 3 is a plot 300 of measured oxide thickness (illustrated in arbitrary units, a.u.) versus gate leakage current for an oxide test structure according to an embodiment. The test structure was built according to a 40 nm node technology. A reduction in gate oxide thickness (Tox) from 18.5 Angstroms to 18.0 Angstroms results in an increase in gate leakage current (Igate) of about 60%. Gate oxide thickness can be inferred by measuring gate leakage current. The relationship between gate leakage current and gate dielectric thickness (and hence optimal Vgg level) is established for particular processes or designs. For example, Igate-Tox relationship established for thermally grown gate oxide might be different from that for a nitrided gate dielectric.

In an IC according to an embodiment, Tox can be inferred from Igate from the relationship between these parameters established for that IC or IC fabrication, which is based on process control and device design and is well-characterized once a process node is optimized and stabilized for manufacturing. For example, in processes known to produce consistent gate oxide thickness across a wafer (i.e., negligible runout), Tox might be characterized on a per-wafer basis. In other embodiments, Tox is characterized for each IC die, adjacent IC dice, or for sectors of a wafer, such as by putting Tox evaluation structures embedded in an FPGA or in the scribe alleys and using the resultant value to determine the Vgg level for the associated IC dice or all IC dice with a sector of the wafer. Using a scribe lane for the evaluation structure typically involves collecting electronic test (i.e., probe) data in the wafer fabrication area and providing the test data to the die test/die trimming operation, which may be a physically remote location. Providing one or more evaluation structures according to one or more embodiments on a die allows an electronic test facility to test (probe) Tox and use the resulting data within the test flow to program the optimum Vgg trim level.

Figure 4:
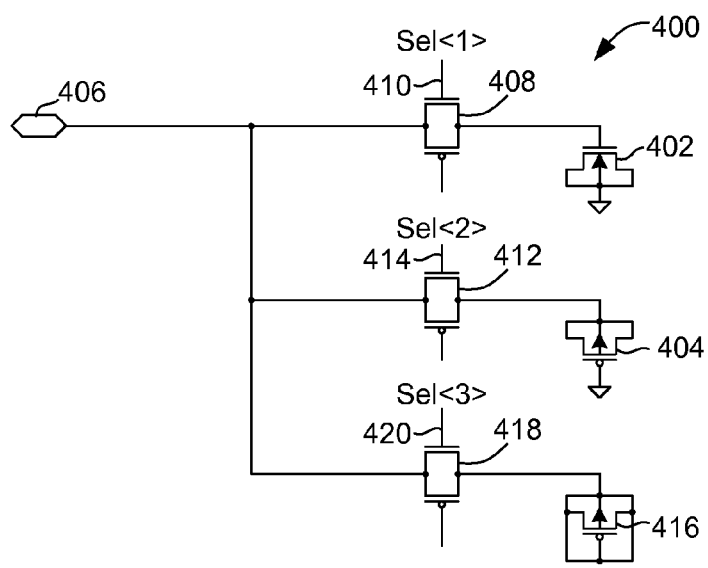
FIG. 4 is a circuit diagram of an oxide test structure according to an embodiment.

FIG. 4 is a diagram of a gate dielectric test structure 400 on an IC or IC wafer according to an embodiment. The gate dielectric test structure 400 allows measurement of gate leakage current through an NMOS gate leakage current device 402 and through a PMOS gate leakage current device 404. The NMOS device is connected to a test-only pad 406 through a first switch 408, which is a CMOS switch activated by a control signal sel <1> 410. The test-only pad 406 is unbonded and unconnected to other nodes in the IC or of the IC wafer. A test probe or similar contact is made to the pad 406 to measure current through the pad; hence, the pad 406 is used for test only.

The PMOS device 404 is similarly connected to the test-only pad 406 through a second switch 412 activated by a second control signal sel <2> 414. A PMOS capacitor 416 for Nwell-to-P substrate leakage measurement is optionally included to measure the well-substrate leakage current, which is subtracted from the current measurement of the PMOS device 404 to obtain a more accurate measurement of the PMOS gate leakage current. The PMOS capacitor 416 is connected to the test-only pad 406 through a third switch 418 activated by a third control signal sel <3> 420.

Deselecting all leakage current structures (i.e., turning the switches 408, 412, 418 off) and measuring the background leakage current at the test-only pad 406 provides a reference leakage current that the other leakage currents are compared against. In one embodiment, the switch 408 is turned on while the other switches 412, 418 are held off and the leakage current through the pad is measured to obtain the NMOS leakage current (Jg-NMOS). The switch 408 is turned off, and the switch 412 is turned on to obtain the PMOS leakage current (Jg-PMOS). The switches 408, 412 are turned off and switch 418 is turned on to measure the PMOS Nwell to P-type substrate leakage current. The PMOS oxide may be different in thickness from the NMOS oxide, and the TDDB of the PMOS gate oxide may be different from the TDDB of the NMOS gate oxide, so both PMOS and NMOS gate leakage currents provide information for setting Vgg in some embodiments.

Gate dielectric test structures are included in various locations on a wafer or an IC die in various embodiments. In an IC fabrication process in which the gate dielectric thickness is typically well controlled and quite uniform across the IC (i.e., low run-out), gate dielectric test structures are placed in selected locations on a wafer. In a particular embodiment, the dielectric test structure 400 is fabricated in a singulation alley (e.g., a scribe or saw lane) of an IC wafer. Placing the dielectric test structures on portions of silicon that are not used in the final IC dice conserves silicon area of the dice and allows incorporation into IC wafers without altering the IC design. The capacitors 402, 404, 416 in the gate dielectric test structure 400 are not building blocks of a conventional IC. In other words, they are not configured from the fabric of an FPGA, and are connected to the test-only pad 406 to avoid stray currents from causing an error in gate leakage current measurements. The gate dielectric test structure is designed into the mask artwork. In a particular embodiment, an IC has a Vgg supply circuit that provides a selected Vgg level to the IC according to a trim circuit. The trim circuit is a programmable resistor network, for example.

In an alternative embodiment, a direct or indirect measurement of the capacitance of a reference capacitor comprised of gate oxide may be used to deduce the Tox info. For example, an LC oscillator may be formed using a known L component having a well calibrated inductance with controlled variation. The frequency of the formed LC resonance circuit may be digitally measured and probed through FPGA fabric acting as a frequency counter, facilitating easy data collection. In a particular embodiment, gate dielectric thickness of the IC is measured by directly measuring gate capacitance (e.g., by using a calibrated capacitance probe and test instrument) of a test structure having N-MOS and P-MOS devices in test structure through a test only probe pad.

Figure 5:
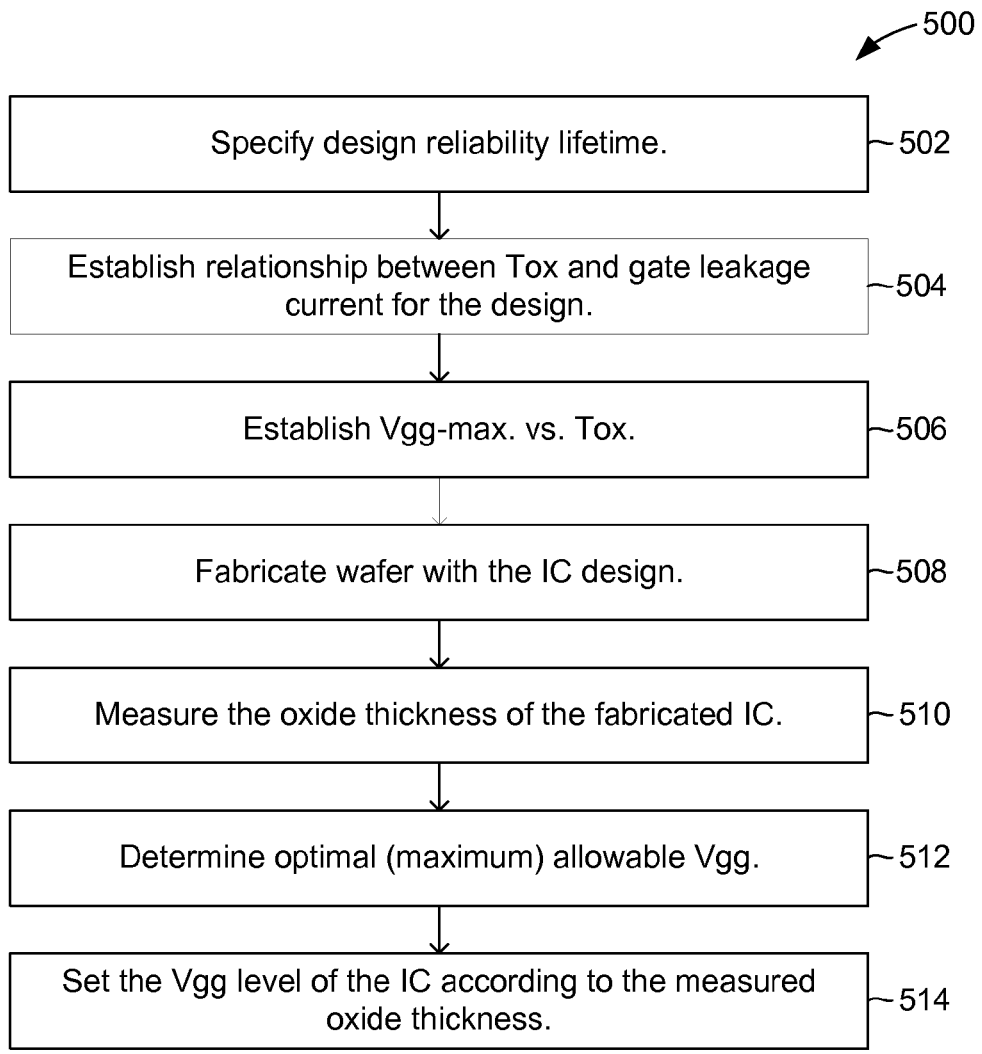
FIG. 5 is a flow chart of a method of setting Vgg in an IC according to an embodiment.

FIG. 5 is a flow chart of a method of setting Vgg in an IC die 500 according to an embodiment. A design reliability lifetime is specified for the IC design (step 502). A relationship between gate dielectric thickness and gate leakage current for a gate dielectric test structure is established for an IC fabrication sequence (step 504). A relationship between maximum gate bias voltage and gate dielectric thickness sufficient to achieve the design reliability lifetime is determined for the IC (step 506). The maximum gate bias voltage is the highest gate voltage that can be applied to the gate terminals of interconnect circuits of the IC without causing TDDB failures for both N- and P-MOS, during the reliability lifetime specified in step 502.

An IC wafer including the IC die is fabricated (step 508), and the gate dielectric thickness of the fabricated IC die is determined (step 510). In a particular embodiment, the gate dielectric thickness is determined by measuring a leakage current of one or more MOS capacitors in a gate dielectric test structure on the IC wafer. A maximum gate bias voltage for the IC is determined according to the measured gate dielectric thickness and the relationship between the maximum gate bias and gate dielectric thickness (step 512), and the IC die is trimmed (step 514) according to the measured Tox to provide a Vgg of the optimal gate bias voltage (i.e., the highest operating voltage that will achieve the reliability lifetime). In a particular embodiment, resistors of a resistor network are programmed to set Vgg to the optimal gate bias voltage for each individual die.

Figure 6:
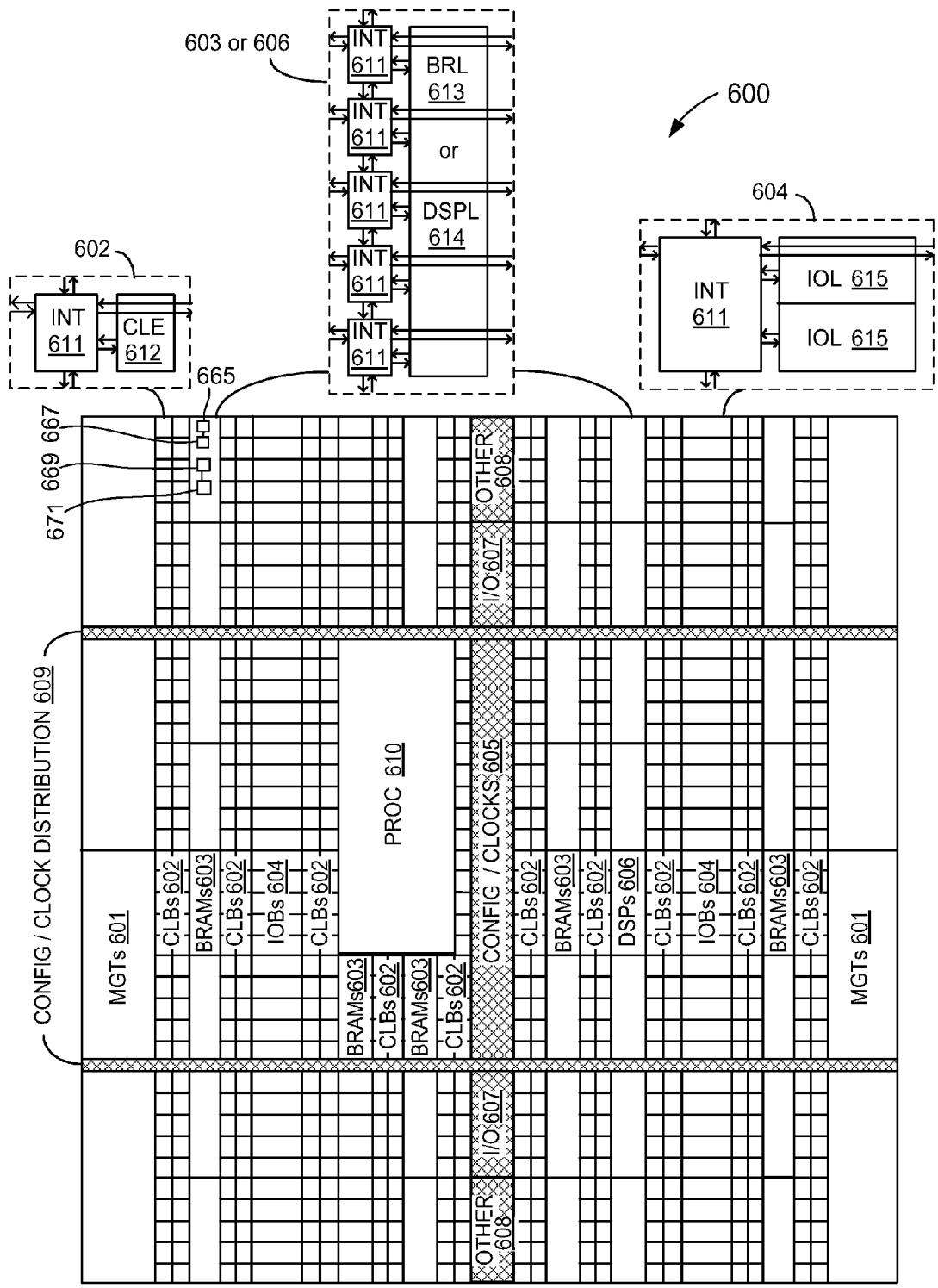
FIG. 6 is a plan view of an FPGA with an oxide test structure according to an embodiment.

FIG. 6 is a plan view of an FPGA 600 with an oxide test structure 665 including an external test pad (i.e., an otherwise unconnected pad) 667 according to an embodiment. The FPGA is fabricated using a CMOS fabrication process or mixed CMOS/NMOS process and incorporates a Vgg trim circuit 669 that controls the output of a Vgg supply circuit 671 programmed according to an embodiment of the invention. In an alternative embodiment, an oxide test structure is fabricated in a scribe lane adjacent to the FPGA 600.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element (INT 611). A differential I/O buffer 618 is also part of IOB 604. As will be clear to those of skill in the art, the actual I/O pads connected, for example, to the differential I/O buffer 618 are manufactured using metal layers above the various illustrated logic blocks, and typically are not confined to the area of the input/output differential I/O buffer 618. In the pictured embodiment, a columnar area near the center of the die is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of unit cells, array cores, logic gates, and control devices and circuits could be alternatively used. Therefore, the spirit and scope of the appended claims should not be limited to the foregoing description.

What is claimed is:

1. An integrated circuit wafer comprising:
  a gate dielectric thickness test structure configured to determine a gate dielectric thickness; and
  an integrated circuit (IC) having a Vgg supply circuit configured to establish a gate bias voltage based on a specified reliability lifetime and the gate dielectric thickness determined by the gate dielectric thickness test structure;
  wherein the gate dielectric thickness test structure includes:
    a test pad,
    an NMOS gate leakage current device connected to the test pad through a first switch, and
    a PMOS gate leakage current device connected to the test pad through a second switch;
  wherein the gate dielectric thickness test structure is configured to determine the gate dielectric thickness based at least on a leakage current of the NMOS gate leakage current device, or a leakage current of the PMOS gate leakage current device, measured at the test pad; and
  wherein the integrated circuit wafer or the IC includes the gate dielectric thickness test structure.

2. The IC wafer of claim 1 wherein the NMOS gate leakage current device comprises an NMOS field-effect transistor having a gate terminal connected to the first switch, and a source terminal, a drain terminal and a well connected to a ground potential.

3. The IC wafer of claim 1 wherein the PMOS gate leakage current device has a gate terminal connected to a ground potential and a source terminal, a drain terminal and a well connected to the second switch.

4. The IC wafer of claim 1 wherein the gate dielectric thickness test structure further comprises a PMOS well leakage current device having a gate terminal, a source terminal, a drain terminal, and a well connected to the external test pad through a third switch.

5. The IC wafer of claim 1 wherein the gate dielectric thickness test structure is defined in the IC.

6. The IC wafer of claim 1 wherein the IC further includes a Vgg trim circuit electrically coupled to the Vgg supply circuit, wherein the Vgg supply circuit is configured to establish the gate bias voltage based on a programmed resistor network of the Vgg trim circuit.

7. A method of setting a gate bias voltage for a Vgg supply circuit in an integrated circuit (IC) comprising:
  specifying a design reliability lifetime for the IC;
  establishing a relationship between maximum gate bias voltage and gate dielectric thickness for the IC sufficient to achieve the design reliability lifetime;
  fabricating an IC wafer including the IC;
  measuring a gate dielectric thickness of the IC;
  determining the maximum gate bias voltage for the IC according to the measured gate dielectric thickness and the relationship between maximum gate bias voltage and the gate dielectric thickness; and
  setting the gate bias voltage for the Vgg supply circuit of the IC to the maximum gate bias voltage, wherein the act of setting the gate bias voltage for the Vgg supply circuit comprises programming a trimable resistor network of the IC.

8. The method of claim 7 further comprising
  establishing a relationship between gate dielectric thickness and gate leakage current for a gate dielectric thickness test structure wherein fabricating the IC wafer includes fabricating the gate dielectric thickness test structure on the IC wafer, and wherein measuring the gate dielectric thickness of the IC includes measuring a gate leakage current using the gate dielectric test structure.

9. The method of claim 8 wherein the gate dielectric test structure includes a test-only pad, and measuring the gate leakage current comprises probing the test-only pad.

10. The method of claim 9 wherein the gate leakage current is an NMOS gate leakage current of an NMOS gate leakage test device of the gate dielectric test structure.

11. The method of claim 8 wherein measuring a gate leakage current includes measuring a first gate leakage current of an NMOS gate leakage current device and measuring a second gate leakage current of a PMOS gate leakage current device.

12. The method of claim 11 wherein measuring the second gate leakage current of the PMOS gate leakage current device further includes measuring a well-to-substrate leakage current.

13. The method of claim 7 wherein measuring the gate dielectric thickness of the IC includes directly measuring gate capacitance of test structure N-MOS and P-MOS through a test only probe pad.

14. The method of claim 7 wherein measuring the gate dielectric thickness of the IC includes measuring a resonant frequency of an LC oscillator in the IC.

15. The method of claim 14 wherein the LC oscillator is configured in a field programmable gate array.

* * * * *